(12) United States Patent
Ren (10) Patent No.: US 12,008,186 B2
(45) Date of Patent: Jun. 11, 2024

(54) TOUCH PANEL ASSEMBLY AND ELECTRONIC DEVICE

(71) Applicant: Lenovo (Beijing) Limited, Beijing (CN)

(72) Inventor: Chun Ren, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 42 days.

(21) Appl. No.: 17/549,825

(22) Filed: Dec. 13, 2021

(65) Prior Publication Data

US 2022/0308725 A1  Sep. 29, 2022

(30) Foreign Application Priority Data

Mar. 29, 2021 (CN) .......................... 202110334877.4

(51) Int. Cl.
| | |
|---|---|
| *G06F 3/041* | (2006.01) |
| *G06F 3/0354* | (2013.01) |
| *H03K 17/96* | (2006.01) |
| *H03K 17/965* | (2006.01) |

(52) U.S. Cl.
CPC ...... *G06F 3/04144* (2019.05); *G06F 3/03547* (2013.01); *H03K 17/9618* (2013.01); *H03K 17/965* (2013.01); *G06F 3/0414* (2013.01); *H03K 2217/96023* (2013.01)

(58) Field of Classification Search
CPC ............ G06F 3/04144; G06F 3/03547; G06F 3/0414; H03K 17/9618; H03K 17/965; H03K 2217/96023
See application file for complete search history.

(56) References Cited

U.S. PATENT DOCUMENTS

| | | | | |
|---|---|---|---|---|
| 6,323,445 | B1 * | 11/2001 | Yee ....................... | H01H 13/702 |
| | | | | 200/305 |
| 2002/0033795 | A1 * | 3/2002 | Shahoian ............ | G06F 3/03547 |
| | | | | 345/156 |

(Continued)

FOREIGN PATENT DOCUMENTS

| | | |
|---|---|---|
| CN | 101571769 A | 11/2009 |
| CN | 203689477 U | 7/2014 |

*Primary Examiner* — Patrick N Edouard
*Assistant Examiner* — Joseph P Fox
(74) *Attorney, Agent, or Firm* — ANOVA LAW GROUP, PLLC (57) ABSTRACT

The present disclosure provides a touch panel assembly and an electronic device. The touch panel assembly includes a touch panel, a touch switch, and a transmission assembly. The touch panel receives a touch operation from a user. The touch switch is positioned below the touch panel and located at a center position of the touch panel. The transmission assembly drives the touch panel to ascend and descend along a vertical direction synchronously and across an entire touch surface, and the touch panel activates the touch switch while descending. When subject to a given force, any touch areas of the touch panel can be pressed down, the touch panel stably moves synchronously and across its entire touch surface, so as to increase product stability. The touch panel assembly can achieve technical effects of a uniform touch feedback and the touch panel's stable movement, and so as to effectively improve user experiences.

19 Claims, 5 Drawing Sheets

(56) References Cited

U.S. PATENT DOCUMENTS

| | | | |
|---|---|---|---|
| 2004/0196268 A1* | 10/2004 | Hsu | G06F 1/169 |
| | | | 345/173 |
| 2010/0300770 A1* | 12/2010 | Bender | G06F 3/03547 |
| | | | 178/18.03 |
| 2010/0302153 A1* | 12/2010 | Jung | G06F 3/03547 |
| | | | 345/158 |
| 2012/0319969 A1* | 12/2012 | Yamamoto | G06F 3/03547 |
| | | | 345/173 |
| 2015/0009156 A1* | 1/2015 | Hsueh | H01H 3/125 |
| | | | 345/173 |

* cited by examiner

TOUCH PANEL ASSEMBLY AND ELECTRONIC DEVICE

RELATED APPLICATION(S)

This application claims priority to Chinese Patent Application No. 202110334877.4 entitled "TOUCH PANEL ASSEMBLY AND ELECTRONIC DEVICE" and filed with the National Intellectual Property Administration, PRC on Mar. 29, 2021, which is incorporated herein by reference in entirety.

FIELD OF THE TECHNOLOGY

The present disclosure relates to an electronic device technical area, and in particular to a touch panel assembly and an electronic device.

BACKGROUND

At present, electronic devices using touch panels are becoming more and more popular, especially touch devices such as notebook computers, touch screen mobile phones, in-vehicle equipment, and industrial control equipment. However, due to the structure of the touch panel, each touch area on the touch panel requires different levels of pressure to be pressed down. For example, a greater pressing-down force is required at a side of the panel that is farther away from a user than at a side of the panel that is closer to the user. Accordingly, the user needs to control the amount of the pressing-down force when pressing-down different areas of the panel, so as to better control operating the touch panel. This leads to poor human-computer interaction effects of the touch panel and uneven touch feedback, which is not conducive to improvement in user experience.

SUMMARY

In view of the above-identified technical problems present in the existing art, the present disclosure provides a touch panel assembly and an electronic device, where the touch panel can synchronously ascend and descend across an entire touch surface, so as to achieve a uniform touch feedback and to improve user experiences.

The present disclosure provides a touch panel assembly, including: a touch panel, configured to receive a touch operation from a user; a touch switch, positioned below the touch panel and corresponding to a center position of the touch panel; and a transmission assembly, configured to drive the touch panel to ascend and descend wholly and synchronously along a vertical direction, where the touch panel activates the touch switch while descending.

In certain embodiment(s), the touch panel assembly further includes a frame assembly, where the frame assembly includes a first frame to support the touch panel and a second frame positioned at a side of the first frame that is further away from the touch panel, a movement gap is present between the first frame and the second frame, and where the transmission assembly connects the first frame and the second frame such that the touch panel ascends and descends synchronously with the first frame.

In certain embodiment(s), the transmission assembly includes multiple balance shafts, where the balance shaft includes a first shaft body rotatably connected to the first frame and a second shaft body rotatably connected to the second frame and in fixed connection to the first shaft body, the multiple balance shafts collaborate with each other such that the first frame drives the touch panel to ascend and descend wholly and synchronously along a vertical direction when the first frame is subject to force.

In certain embodiment(s), the multiple balance shafts are arranged one by one along a side of the first frame.

In certain embodiment(s), the transmission assembly includes a first bracket and a second bracket, two opposing ends of the first bracket are respectively connected to the first frame and the second frame, and two opposing ends of the second bracket are respectively connected to the first frame and the second frame, and where the first bracket is inserted into the second bracket, to limit lateral movement between the first frame and the second frame.

In certain embodiment(s), the first frame is a panel in shape, where the first frame is provided with multiple first clamping portions, the multiple first clamping portions are arranged on the panel along a first direction and a second direction, the second frame is provided with multiple second clamping portions to correspond with the multiple first clamping portions and hence to limit movement of the first frame along the first direction and along the second direction, and where the first direction is perpendicular to second direction.

In certain embodiment(s), the touch switch is configured to cancel force applied to the touch panel so as to cause the touch panel to reset, where the touch panel assembly further includes multiple elastic tongues, two opposing ends of the elastic tongue are respectively connected to the first frame and the second frame, to apply to the first frame a force to cause the touch panel to reset.

In certain embodiment(s), a side of the first frame protrudes downward to form a first limiting portion, a side of the second frame protrudes upward to form a second limiting portion in a clamping engagement with the first limiting portion, and where the second limiting portion is positioned above the first limiting portion to limit upward movement of the first frame by having the first limiting portion ascent and touch the second limiting portion while the first frame is in a process of resetting.

In certain embodiment(s), the first shaft body and the second shaft body are each a rod in shape, and the second shaft body is formed by bending outwards two ends of the first shaft body, and where the first frame and the second frame are each a rectangle in shape, the multiple balance shafts include four balance shafts, and the four balance shafts are arranged respectively at four sides of the rectangle.

The present disclosure provides an electronic device, including the touch panel assembly.

In comparison to existing technologies, the present disclosure is beneficial in that: by positioning the touch switch below the touch panel and locating the touch switch at a center position of the touch panel, and by having the transmission assembly configured to drive the touch panel to ascend and descend along a vertical direction synchronously and across an entire touch surface, the present disclosure realizes that when subject to a given force, any touch areas of the thus-formed touch panel can be pressed down, the touch panel stably moves synchronously and across its entire touch surface, so as to increase product stability. The touch panel assembly can achieve technical effects of a uniform touch feedback and the touch panel's stable movement, and so as to effectively improve user experiences.

BRIEF DESCRIPTION OF THE DRAWINGS

In the drawings that are not necessarily drawn to scale, same reference numerals may describe similar components in different views. The same reference numerals with letter suffixes or different letter suffixes may indicate different examples of similar components. The drawings generally show various embodiments by way of example rather than limitation, and are used together with the specification and claims to describe the disclosed embodiments. When appropriate, the same reference numerals are used in all drawings to refer to same or similar components. Such embodiments are illustrative, and are not intended to be exhaustive or exclusive embodiments of the present device or method.

Components indicated by reference numerals of the drawings:

100—touch panel assembly; 200—electronic device; 1—touch panel; 2—touch switch; 3—transmission assembly; 31—balance shaft; 32—first shaft body; 33—second shaft body; 34—first bracket; 35—second bracket; 4—frame assembly; 41—first frame; 42—second frame; 43—first clamping portion; 44—second clamping portion; 45—first limiting portion; 46—second limiting portion; 5—PCB board.

DETAILED DESCRIPTION

In order to enable those skilled in the art to better understand the technical solutions of the present disclosure, the present disclosure is described in detail below with reference to the accompanying drawings and the disclosed embodiments. The following describes the embodiments of the present disclosure in further detail with reference to the accompanying drawings and specific embodiments, but it is not intended to limit the present disclosure.

Terms used in the present disclosure, such as "first", "second", and the like, do not indicate any order, quantity or importance, but are only used to distinguish different parts. Terms such as "include" or "include" or the like indicate that an element before a term covers element(s) positioned after the term, and does not exclude the possibility that other elements may also be covered. "Up", Terms such as "up", "down", "left", and "right" are only used to indicate a relative position relationship. When an absolute position of a described object changes, the relative position relationship may also change accordingly.

In the present disclosure, when it is described that a specific device is located between a first device and a second device, there may or may not be an intermediate device between the specific device and the first device or the second device. When it is described that a specific device is connected to another device, the specific device may be directly connected to the other device without an intervening device, or may not be directly connected to the other device but with an intervening device.

All terms (including technical terms or scientific terms) used in the present disclosure have a same meaning as understood by those of ordinary skill in the art to which the present disclosure belongs, unless specifically defined otherwise. It should also be understood that terms such as those defined in general-purpose dictionaries should be interpreted as having meanings consistent with their meanings in the context of related technologies, and should not be interpreted in idealized or extremely formalized meanings, unless explicitly stated herein.

The technologies, methods, and equipment known to those of ordinary skill in relevant fields may not be discussed in detail, but where appropriate, the technologies, methods, and equipment should be regarded as part of the present disclosure.

Figure 1:
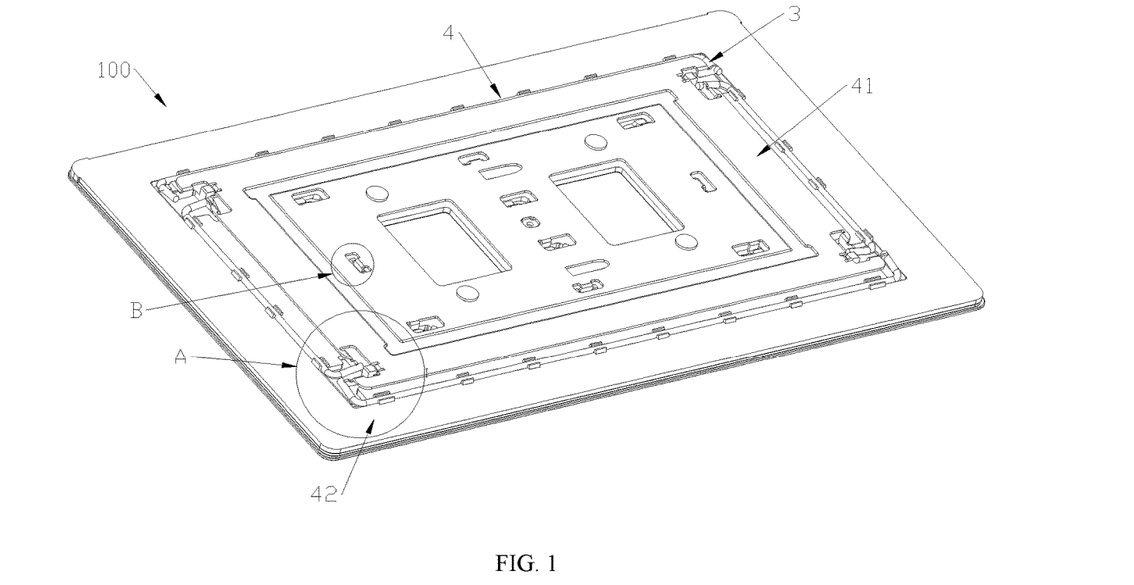
FIG. 1 is a schematic structural diagram of a touch panel assembly according to embodiment(s) of the present disclosure, where the transmission assembly as shown includes a balance shaft.

Embodiments of the present disclosure provide a touch panel assembly 100, as shown in FIGS. 1 to 5, where FIG. 1 is a top-down view of the touch panel assembly 100, where the touch panel assembly 100 includes a touch panel 1, a touch switch 2, a PCB board, and a transmission assembly 3, and where the touch switch 2 is arranged or supported on the PCB board 5. The touch panel 1 is employed to receive user touch operations. The touch switch 2 is located below the touch panel 1, and the touch switch 2 is located at a center position of the touch panel 1. The transmission assembly 3 is employed to drive the touch panel 1 to perform ascending and/or descending across its entire touch surface along a vertical direction, and the touch panel 1 triggers or activates the touch switch 2 when the touch panel 1 is in a descending movement.

Figure 5:
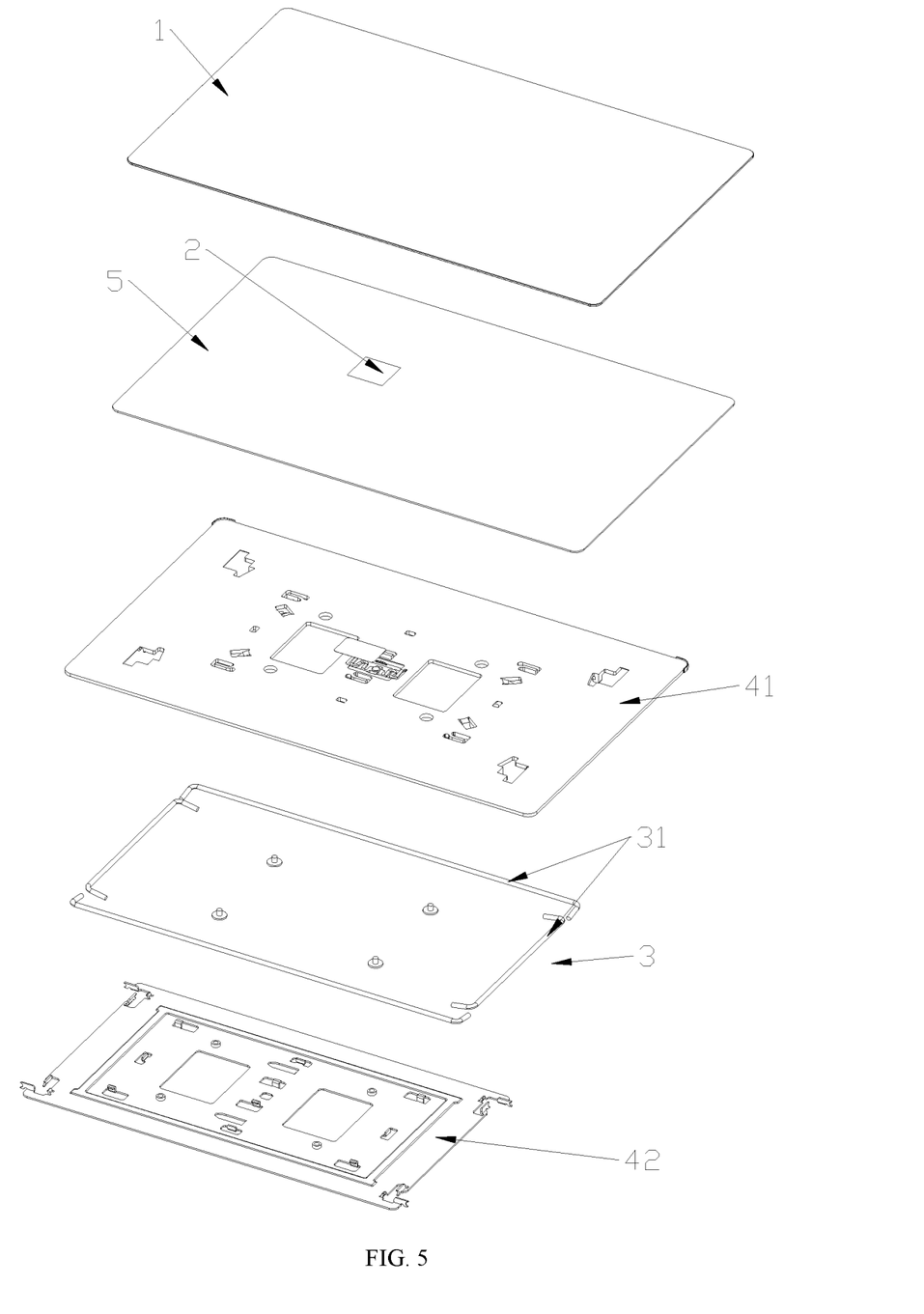
FIG. 5 is an exploded view of the touch panel assembly according to embodiment(s) of the present disclosure.

In certain embodiment(s), the center position of the touch panel 1 may be a position in equal distance to a perimeter of the touch panel 1. For example, in embodiments where the touch panel 1 is a rectangle in shape (as shown in FIGS. 1 and 5), the center position is at an intersection of two diagonals of the rectangle. In embodiments where the touch panel 1 is a circle in shape, the center position of the touch panel 1 is at the center of the circle. In embodiments where the touch panel 1 is a regular polygon in shape, the center position at the center of the regular polygon. By locating the touch switch 2 at the center position of the touch panel 1, with a user's force applied to any touch areas of the touch panel 1, the touch panel 1 may stably descend to activate the touch switch 2 located at the center position.

In certain embodiment(s), the vertical direction is a direction perpendicular to the horizontal plane. Once the touch panel assembly 100 is in use, a surface of the touch panel 1 is parallel to the horizontal plane, that is, the touch panel 1 ascends and/or descends along the vertical direction. During an ascending or a descending movement, a surface of the touch panel 1 ascends or descends altogether, such that the surface of the touch panel 1 maintains perpendicular to the horizontal plane while moving, and avoids tilting.

In certain embodiment(s), the touch panel assembly 100 is applied to an electronic device 200, the electronic device 200 has a base plate corresponding to the touch panel assembly 100, and the transmission assembly 3 is connected to the base plate such that the touch panel assembly 100 may firmly ascend and/or descend relative to the base plate of the electronic device 200 via the transmission assembly 3. The electronic device 200 may be one of smart devices such as a notebook computer, a smart phone, and a tablet computer, which is not specifically limited in the present disclosure.

By locating the touch switch 2 at the center position of the touch panel 1, and by having the transmission assembly 3 drive the touch panel 1 to ascend and descend along a vertical direction synchronously and across its entire touch surface, the present disclosure realizes that a panel surface of the touch panel 1 maintains a perpendicular and vertical direction while in motion, such that any touch areas of the touch panel 1 may be pressed down upon receipt of a same given force, the touch panel 1's synchronous movement across the entire touch surface is stable, and product satiability may be improved. The touch panel assembly can achieve technical effects of a uniform touch feedback and the touch panel's stable movement, and so as to effectively improve user experiences.

In certain embodiment(s), and as shown in FIGS. 1 and 5, the touch panel assembly 100 further includes a frame assembly 4, and the frame assembly 4 includes a first frame 41 supporting the touch panel 1 and a second frame 42 positioned at a side of the first frame 41 that is further away from the touch panel 1. A movable interval is positioned between the first frame 41 and the second frame 42. The transmission assembly 3 is respectively connected to the first frame 41 and the second frame 42 such that the first frame 41 ascends and/or descends along with the touch panel 1.

In certain embodiment(s), and once the touch panel assembly 100 is in use, the touch panel 1 is located at a top most position, followed in turn by the touch switch 2, the first frame 41, and the second frame 42 that are sequentially arranged below the touch panel 1 from top to bottom. The touch panel 1 and the touch switch 2 are both supported on the first frame 41. The first frame 41 drives the touch panel 1 and the touch switch 2 to move up and down relative to the second frame 42. Once the touch panel 1 and the first frame 41 are pressed down to their limit, the touch panel 1 activates the touch switch 2 on the PCB board 5, so as to realize control through the touch switch 2. Once a force applied to the touch panel 1 is cancelled, the touch switch 2 makes the touch panel 1 to move up and reset.

In certain embodiment(s), the first frame 41 and the second frame 42 may each be a thin plate in shape, may be provided with multiple weight-reducing grooves, to reduce weight of the touch panel assembly 100.

In certain embodiment(s), an upper side and a lower side of the transmission assembly 3 are respectively connected to the first frame 41 and the second frame 42, and the transmission assembly 3, rotatably or via an intersecting motion, drives the first frame 41 to move up and down relative to the second frame 42.

Figure 4:
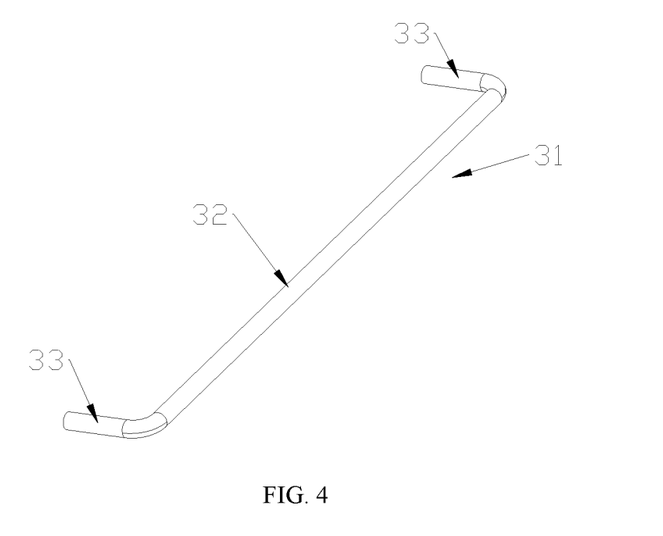
FIG. 4 is a schematic structural diagram of a balance shaft of the touch panel assembly according to embodiment(s) of the present disclosure.

In certain embodiment(s), and as shown in FIG. 4 and FIG. 5, the transmission assembly 3 includes multiple balance shafts 31, the balance shaft 31 includes the first shaft body 32 and the second shaft body 33 in fixed connection to the first shaft body 32, the first shaft body 32 is rotatably connected to the first frame 41, the second shaft body 33 is rotatably connected to the second frame 42, the multiple balance shafts 31 collaborate with each other to cause the frame 41 to drive the touch panel 1 to ascend and descend along a vertical direction synchronously and across its entire touch surface in response to a force being applied to the first frame 41.

In certain embodiment(s), two second shaft bodies 33 are connected to the first shaft body 32, and the two second shaft bodies 33 are respectively connected to opposing ends of the first shaft body 32, such that the balance shaft 31 may drive the first frame 41 to move smoothly.

In certain embodiment(s), the first frame 41 may be provided with a first groove to receive a portion of the first shaft body 32, so as to facilitate rotation of the first shaft body 32 via the portion received inside of the first groove. Multiple first grooves can be provided, and they can be provided along the length direction of the first shaft body 32. Multiple first grooves may be employed, and may be positioned along a length direction of the first shaft body 32.

In certain embodiment(s), the second frame 42 may be provided with a second groove to receive a portion of the second shaft body, so as to facilitate rotation of the second shaft body 33 via the portion received inside of the second groove.

In certain embodiment(s), the multiple balance shafts 31 are arranged one-by-one at a side of the first frame 41.

In certain embodiment(s), multiple balance shafts 31 may be arranged corresponding to a shape of the first frame 41. For example, when a cross-section of the first frame 41 is rectangular in shape, the number of balance shafts 31 may be four, and the four balance shafts 31 may be arranged respectively along the width and the length directions. The four balance shafts 31 cooperate with each other to make the first frame 41 move up and down stably relative to the second frame 42. In certain embodiment(s), a cross-section of the first frame 41 is circular in shape, and the first shaft body 32 of the balance shaft 31 may be arc-shaped, and multiple balance shafts 31 are correspondingly arranged along a circular side of the first frame 41. In certain embodiment(s), a cross-section of the first frame 41 is a regular polygon in shape, the number of balance shafts 31 may correspond to the number of sides of the regular polygon.

In certain embodiment(s), the multiple balance shafts 31 may be arranged one-by-one and head-to-toe, so as to effect a stable movement of the first frame 41 relative to the second frame 42.

Figure 6:
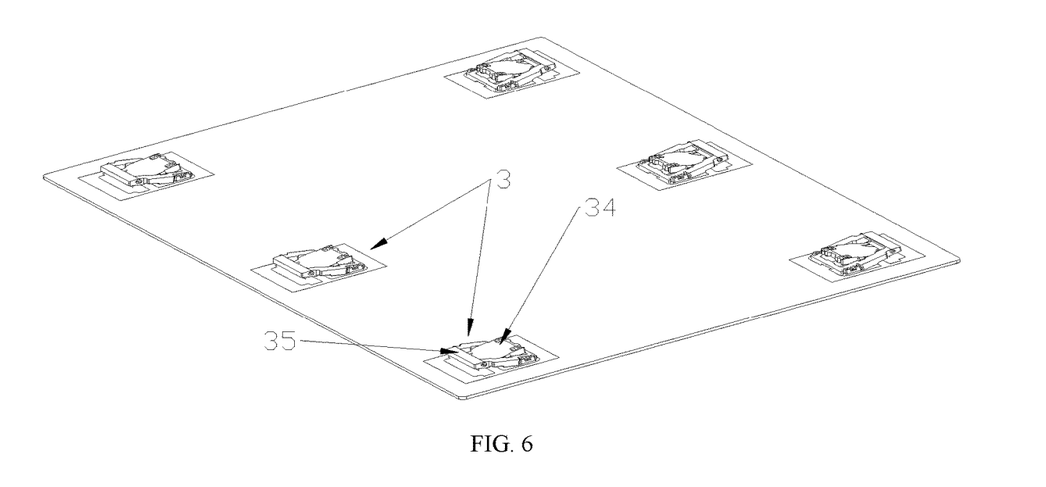
FIG. 6 is a partial schematic structural view of the touch panel assembly according to embodiment(s) of the present disclosure, where the transmission assembly as shown includes a first bracket and a second bracket.
Figure 7:
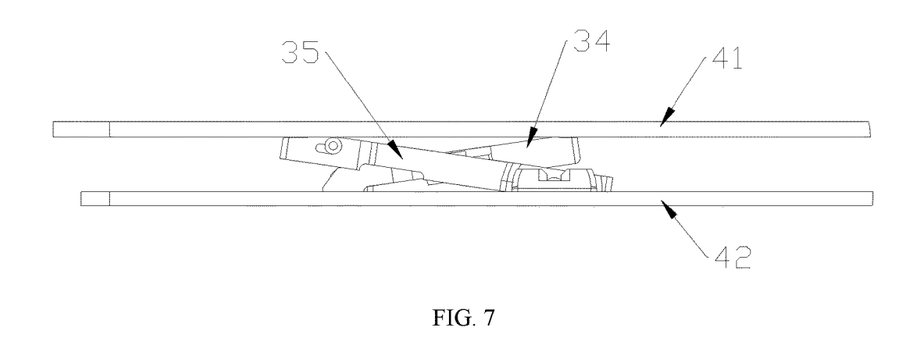
FIG. 7 is a partial side view of the touch panel assembly according to embodiment(s) of the present disclosure, where the transmission assembly as shown includes a first bracket and a second bracket.

In certain embodiment(s), and as shown in FIGS. 6 and 7, the transmission assembly 3 may include a first bracket 34 and a second bracket 35, opposing ends of each of which are pivotally connected to the first frame 41 and the second frame 42, respectively. The first bracket 34 is engaged with the second bracket 35 to limit lateral movement of the first bracket 34 relative to the second bracket 35.

In certain embodiment(s), and as shown in FIGS. 7, the first bracket 34 and the second bracket 35 are in a pair-of-scissors like structure, where the first bracket 34 and the second bracket 35 are connected to each other in the middle, and where upper ends of the first bracket 34 and the second bracket 35 are rotatably connected to the first frame 41, and lower ends of the first bracket 34 and the second bracket 35 are rotatably connected to the second frame 42. In certain embodiment(s), the first frame 41 is a rectangle in shape, multiple pairs of the first bracket 34 and the second bracket 35 may be arranged between the first frame 41 and the second frame 42. The present disclosure does not limit a total number of the first bracket 34 or the second bracket 35. In certain embodiment(s), and as shown in FIG. 6, six first brackets 34 and six second brackets 35 may be used. The total number of the first bracket 34 and the total number of second bracket 35 may be suitably increased according to sizes of the first frame 41 and the second frame 42.

In certain embodiment(s), two outer side walls of the first bracket 34 may be positioned with a gap to two inner side walls of the second bracket 35, so as to minimize lateral movement between the first bracket 34 and the second bracket 35 while the first frame 41 is in motion.

Figure 3:
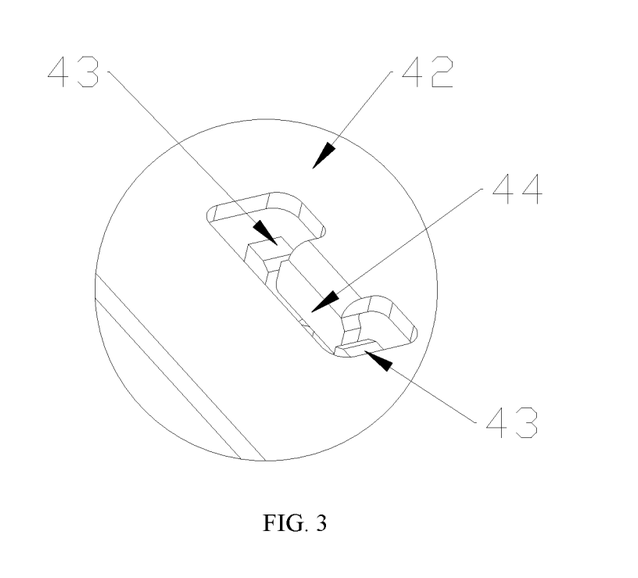
FIG. 3 is an enlarged view of part B of FIG. 1.

In certain embodiment(s), and as shown in FIGS. 1 and 3, the first frame 41 is shaped as a panel, multiple first clamping portions 43 are positioned upon the first frame 41 and protruding out from the first frame 41. The multiple first clamping portions 43 are arranged on the first frame 41 along a first direction and a second direction. The second frame 42 is provided with multiple second clamping portions 44 to correspond to the multiple first clamping portions 43, so as to limit movement of the first frame 41 along the first direction and along the second direction. In certain embodiment(s), the first direction is perpendicular to the second direction.

In certain embodiment(s), and as shown in FIG. 1, the first frame 41 is a rectangular panel in shape, and the first direction and the second direction are respectively a direction along a length extension line and a direction along a width extension line of the first frame 41. Further in view of FIG. 1 and FIG. 3, arranged along the second direction may be a first clamping portion 43, a second clamping portion 44, and another first clamping portion 43, in this order, where the second clamping portion 44 is positioned between the two first clamping portions 43, so as to limit movement of the first frame 41 along the second direction. Similarly, arranged along the first direction may be a first clamping portion 43, a second clamping portion 44, and another first clamping portion 43, in this order, where the second clamping portion 44 is positioned between the two first clamping portions 43, so as to limit movement of the first frame 41 along the first direction. Accordingly, movement of the first frame 41 along the first direction and along the second direction may be limited, so as to reduce left-right movement of the first frame 41 relative to the second frame 42 while ascending and/or descending.

In certain embodiment(s), the touch switch 2 is configured to reset the touch panel 1 by cancelling force applied to the touch panel 1. That is, the touch switch 2 may impart to the touch panel 1 a force which works to drive the touch panel 1 to move away from the second frame 42, such that in response to the force as applied to the touch panel 1 being cancelled, the touch switch 2 can accordingly reset the touch panel 1. The touch panel assembly 100 also includes multiple elastic tongues (not shown in the figure), opposing sides of each of the multiple elastic tongues touch against the first frame 41 and the second frame 42, respectively. The elastic tongues work to apply resetting force to the touch panel 1.

In certain embodiment(s), the multiple elastic tongues may impart force to the touch panel 1 to cause the touch panel 1 to move away from the second frame 42, such that in response to force to the touch panel 1 being cancelled, the multiple elastic tongues help the touch switch 2 effect technical effects of having the touch panel 1 to reset. The multiple elastic tongues may be arranged uniformly between the first frame 41 and the second frame 42, and the multiple elastic tongues may be arranged at a side of the first frame 41.

Figure 2:
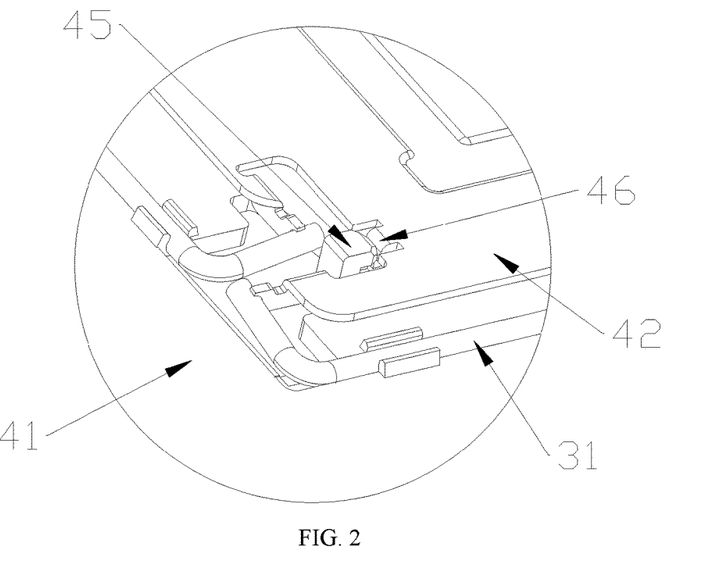
FIG. 2 is an enlarged view of part A of FIG. 1.

In certain embodiment(s), and as shown in FIGS. 1 and 2, a side of the first frame 41 protrudes downward to form a first limiting portion 45, and a side of the second frame 42 protrudes upward to form a second limiting portion 46 to be in engagement with the first limiting portion 45. The second limiting portion 46 is positioned above the first limiting portion 45. In response to the first frame 41 being in a process of resetting, the first limiting portion 45 moves up and touches against the second limiting portion 46, so as to limit ascending movement of the first frame 41.

It may be understood that as the first frame is to reset, the first limiting portion 45 and the second limiting portion 46 are engaged, which works to limit ascending movement of the first frame 41. As the first frame 41 is under force to descend, the first limiting portion 45 is separate or disengaged from the second limiting portion 46. This structure effectively helps limit the ascending movement of the first frame 41, and further, the structure is simple and compact.

In certain embodiment(s), and as shown in FIG. 1 and FIG. 4, the first shaft body 32 and the second shaft body 33 are each a rod in shape, and the second shaft body is formed by bending outwards two ends of the first shaft body, and where the first frame and the second frame are each a rectangle in shape, the multiple balance shafts 31 include four balance shafts, and the four balance shafts are arranged respectively at four sides of the rectangle. This structure is reasonable in design, and further helps stabilize the ascending movement of the first frame 41 relative to the second frame 42.

Figure 8:
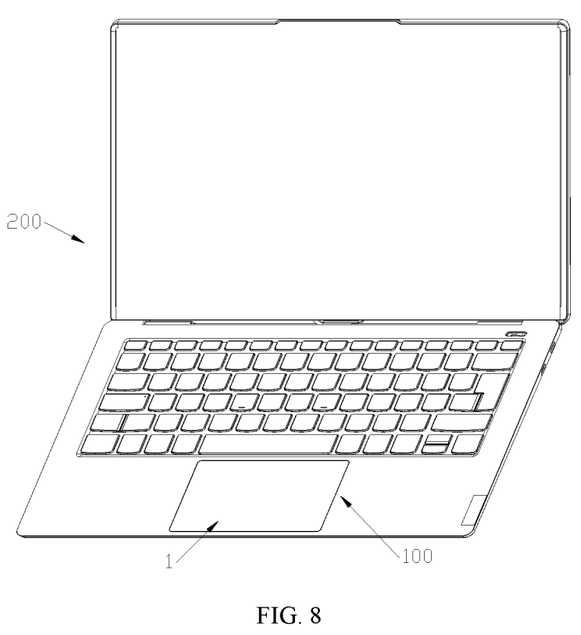
FIG. 8 is a schematic structural view of an electronic device according to embodiment(s) of the present disclosure.

In certain embodiment(s), and as shown in FIG. 8, the present disclosure provides an electronic device 200, which includes the touch panel assembly 100. By locating the touch switch 2 at the center position of the touch panel 1, and by having the transmission assembly 3 to drive the touch panel to ascend and descend synchronously along a vertical direction across an entire touch surface, the electronic device 200 which employs the touch panel assembly 100 causes a panel surface of the touch panel 1 to maintain a perpendicular and vertical direction while in motion, such that when subject to a same given force, any touch areas of the thus-formed touch panel can be pressed down, the touch panel 1 stably moves synchronously and across its entire touch surface, so as to increase product stability. The touch panel assembly can achieve technical effects of a uniform touch feedback and the touch panel's stable movement, and so as to effectively improve user experiences on the electronic device 200.

In certain embodiment(s), the touch panel assembly 100 is applied to the electronic device 200, the electronic device 200 includes a base panel corresponding to the touch panel assembly 100, the transmission assembly 3 may be connected to the base panel such that the touch panel assembly 100 may stably ascend and descend relative to the base panel of the electronic device 200.

In addition, although exemplary embodiments have been described herein, the scope includes any and all implementations with equivalent elements, modifications, omissions, combinations (for example, cross-over arrangements of various embodiments), adaptations, or changes based on the present disclosure. Elements in the claims are interpreted broadly based on the language adopted in the claims, and are not limited to the examples described in this specification or during the implementation of the present disclosure, and the examples are interpreted as non-exclusive. Therefore, the present disclosure and examples are intended to be regarded as examples only, and the true scope and spirit are indicated by the following claims and the full scope of their equivalents.

The above description is intended to be illustrative and not restrictive. For example, the above examples (or one or more of them) can be used in combination with each other. For example, a person of ordinary skill in the art may use other embodiments when reading the forgoing description. In addition, in the foregoing specific embodiments, various features may be grouped together to simplify the present disclosure. This should not be interpreted as an intent that a disclosed feature that is not claimed is necessary for any claim. On the contrary, the subject matter of the present disclosure may be less than all the features of a specific disclosed embodiment. Thus, the following claims are incorporated into the detailed description as examples or embodiments, wherein each claim independently serves as a separate embodiment, and it is considered that these embodiments can be combined with each other in various combinations or permutations. The scope of the present disclosure should be determined with reference to the appended claims and the full scope of equivalents entitled by these claims.

The above embodiments are only exemplary embodiments of the present disclosure, and are not used to limit the present disclosure, and the protection scope of the present disclosure is defined by the claims. Those skilled in the art can make various modifications or equivalent substitutions to the present disclosure within the essence and protection scope of the present disclosure, and such modifications or equivalent substitutions should also be regarded as falling within the protection scope of the present disclosure.

What is claimed is:

1. A touch panel assembly, comprising:
   a touch panel, configured to receive a touch operation from a user;
   a touch switch supported on a PCB board, positioned below the touch panel and corresponding to a center position of the touch panel;
   a transmission assembly, configured to drive the touch panel to ascend and descend along a vertical direction, wherein the touch panel activates the touch switch while descending, and the PCB board is disposed between the touch panel and the transmission assembly; and
   a frame assembly, wherein the frame assembly includes a first frame to support the touch panel and a second frame positioned at a side of the first frame that is further away from the touch panel, and wherein the transmission assembly connects the first frame and the second frame such that the touch panel moves with the first frame.

2. The touch panel assembly of claim 1, wherein the transmission assembly includes at least one balance shaft, the at least one balance shaft includes a first shaft body rotatably connected to the first frame and a second shaft body rotatably connected to the second frame.

3. The touch panel assembly of claim 2, wherein the at least one balance shaft includes a first balance shaft positioned along a length direction of the first frame and a second balance shaft positioned along a width direction of the first frame.

4. The touch panel assembly of claim 2, wherein the first shaft body and the second shaft body are integral to each other.

5. The touch panel assembly of claim 2, wherein the second shaft body is positioned with an angle relative to the first shaft body.

6. The touch panel assembly of claim 2, wherein the second shaft body is shorter in length than the first shaft body.

7. The touch panel assembly of claim 1, wherein the transmission assembly includes a first bracket and a second bracket, two opposing ends of the first bracket are respectively connected to the first frame and the second frame, and two opposing ends of the second bracket are respectively connected to the first frame and the second frame.

8. The touch panel assembly of claim 7, wherein a portion of the first bracket is received through the second bracket so as to reduce lateral movement between the first frame and the second frame.

9. The touch panel assembly of claim 1, wherein the first frame is provided with at least one first clamping portion, the second frame is provided with at least one second clamping portion to engage with the at least one first clamping portion and hence to limit movement of the first frame.

10. The touch panel assembly of claim 9, wherein the at least one first clamping portion includes two first clamping portions, and the at least one second clamping portion is positioned between the two first clamping portions along a lateral direction, so as to limit movement of the first frame relative to the second frame along the lateral direction.

11. The touch panel assembly of claim 10, wherein the lateral direction is a length direction or a width direction.

12. The touch panel assembly of claim 1, wherein a side of the first frame protrudes downward to form a first limiting portion, a side of the second frame protrudes upward to form a second limiting portion, and wherein the second limiting portion is positioned above the first limiting portion to limit upward movement of the first frame.

13. The touch panel assembly of claim 1, wherein:
   the touch switch is located at a second side of the first frame that is opposite to the first side of the first frame and close to the touch panel.

14. A touch panel assembly, comprising:
   a touch panel, configured to receive a touch operation from a user;
   a touch switch supported on a PCB board, positioned below the touch panel and corresponding to a center position of the touch panel;
   a frame assembly, wherein the frame assembly includes a first frame to support the touch panel and a second frame positioned at a side of the first frame that is further away from the touch panel, and wherein the transmission assembly connects the first frame and the second frame such that the touch panel moves with the first frame; and
   a transmission assembly, configured to drive the touch panel to ascend and descend along a vertical direction, wherein the transmission assembly includes at least one balance shaft, the at least one balance shaft includes a first shaft body rotatably connected to the first frame and a second shaft body rotatably connected to the second frame, and the PCB board is disposed between the touch panel and the transmission assembly.

15. The touch panel assembly of claim 14, wherein the at least one balance shaft includes a first balance shaft positioned along a length direction of the first frame and a second balance shaft positioned along a width direction of the first frame.

16. The touch panel assembly of claim 14, wherein the transmission assembly includes a first bracket and a second bracket, two opposing ends of the first bracket are respectively connected to the first frame and the second frame, and two opposing ends of the second bracket are respectively connected to the first frame and the second frame.

17. The touch panel assembly of claim 14, wherein the first frame is provided with at least one first clamping portion, the second frame is provided with at least one second clamping portion to engage with the at least one first clamping portion and hence to limit movement of the first frame.

18. The touch panel assembly of claim 17, wherein the at least one first clamping portion includes two first clamping portions, and the at least one second clamping portion is positioned between the two first clamping portions along a lateral direction, so as to limit movement of the first frame relative to the second frame along the lateral direction.

19. An electronic device, comprising: a touch panel assembly, wherein the touch panel assembly includes:
- a touch panel, configured to receive a touch operation from a user;
- a touch switch supported on a PCB board, positioned below the touch panel and corresponding to a center position of the touch panel;
- a frame assembly, wherein the frame assembly includes a first frame to support the touch panel and a second frame positioned at a side of the first frame that is further away from the touch panel, and wherein the transmission assembly connects the first frame and the second frame such that the touch panel moves with the first frame; and
- a transmission assembly, configured to drive the touch panel to ascend and descend along a vertical direction, wherein the transmission assembly includes at least one balance shaft, the at least one balance shaft includes a first shaft body rotatably connected to the first frame and a second shaft body rotatably connected to the second frame, and the PCB board is disposed between the touch panel and the transmission assembly.

* * * * *